(12) United States Patent
Wang et al.

(10) Patent No.: US 8,890,109 B2
(45) Date of Patent: Nov. 18, 2014

(54) RESISTIVE RANDOM ACCESS MEMORY ACCESS CELLS HAVING THERMALLY ISOLATING STRUCTURES

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Tony P. Chiang, Campbell, CA (US); Tim Minvielle, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/721,658

(22) Filed: Dec. 20, 2012

(65) Prior Publication Data

US 2014/0175356 A1    Jun. 26, 2014

(51) Int. Cl.
*H01L 47/00* (2006.01)
*H01L 45/00* (2006.01)

(52) U.S. Cl.
CPC ........ *H01L 45/1293* (2013.01); *H01L 45/1608* (2013.01)
USPC ................... 257/4; 257/5; 257/134; 257/536; 257/537; 257/E45.001

(58) Field of Classification Search
CPC ... H01L 45/126; H01L 45/145; H01L 45/146; H01L 45/1243
USPC ............. 257/4–5, 43, 135, 536–537, E45.001
See application file for complete search history.

(56) References Cited

U.S. PATENT DOCUMENTS

| | | | | |
|---|---|---|---|---|
| 8,093,680 | B1* | 1/2012 | Rathor et al. | 257/529 |
| 8,415,651 | B2* | 4/2013 | Lung | 257/4 |
| 2010/0085798 | A1* | 4/2010 | Lu et al. | 365/148 |
| 2012/0008366 | A1* | 1/2012 | Lu | 365/148 |

OTHER PUBLICATIONS

Self-Accelerated Thermal Dissolution Model for Reset Programming in Unipolar Resistive-Switching Memory (RRAM) Devices, Ugo Russo, Daniele Ielmini, Carlo Cagli and Andrea L. Lacaita, IEEE Transaction on Electron Devices, vol. 56, No. 2, Feb. 2009, p. 193.*

(Continued)

*Primary Examiner* — Matthew W Such
*Assistant Examiner* — Stephen C Smith

(57) ABSTRACT

Provided are resistive random access memory (ReRAM) cells including resistive switching layers and thermally isolating structures for limiting heat dissipation from the switching layers during operation. Thermally isolating structures may be positioned within a stack or adjacent to the stack. For example, a stack may include one or two thermally isolating structures. A thermally isolating structure may directly interface with a switching layer or may be separated by, for example, an electrode. Thermally isolating structures may be formed from materials having a thermal conductivity of less than 1 W/m*K, such as porous silica and mesoporous titanium oxide. A thermally isolating structure positioned in series with a switching layer generally has a resistance less than the low resistance state of the switching layer. A thermally isolating structure positioned adjacent to a switching layer may have a resistance greater than the high resistance state of the switching layer.

20 Claims, 6 Drawing Sheets

(56) References Cited

OTHER PUBLICATIONS

Choi, S., et al.; Improvement of Uncooled Infrared Imaging Detector by Using Mesoporous Silica as a Thermal Isolation Layer; Jan. 1, 2008; Z—Book—Elsevier; Ceramics International pp. 833836.

Choi, S., et al.; Application of Mesoporous TiO2 as a Thermal Isolation Layer for Infrared Sensors; Jan. 1, 2007; Z—Book—Elsevier; Thin Solid Films pp. 212215.

Tai., Y., et al.; Thermal Conductivity of Heavily Doped LowPressure Chemical Vapor Deposited Polycrystalline Silicon Films; Mar. 1, 1988; American Institute of Physics; J. Appl. Phys. pp. 14421449.

Lohneysen, L., et al.; LowTemperature Thermal Conductiviity of Amorphous Germanium; Nov. 28, 1977; Physikalisches Institut des Universitat zu Koln, Eoln, Germany; Physical Review Letters vol. 39 No. 22 pp. 14201423.

Lysenko, V., et al.; Thermal Isolation in Microsystems with Porous Silicon; Jan. 1, 2002; Z—Book—Elsevier; Sensors and Actuators pp. 1324.

Russo, U., et al.; SelfAccelerated Thermal Dissolution Model for Reset Programming in Unipolar ResistiveSwitching Memory RRAM Devices; Feb. 1, 2009; Academia—Politecnico di Milano; IEEE Transactions on Electron Devices vol. 56 No. 2 pp. 193200.

Sivasubramani, P., et al.; Effect of Composition on the Thermal Stability of Sputter Deposited Hafnium Aluminate and Nitrided Hafnium Aluminate Dielectrics on Si 100; Jan. 1, 2007; American Institute of Physics; Journal of Applied Physics pp. 11410811141086.

* cited by examiner

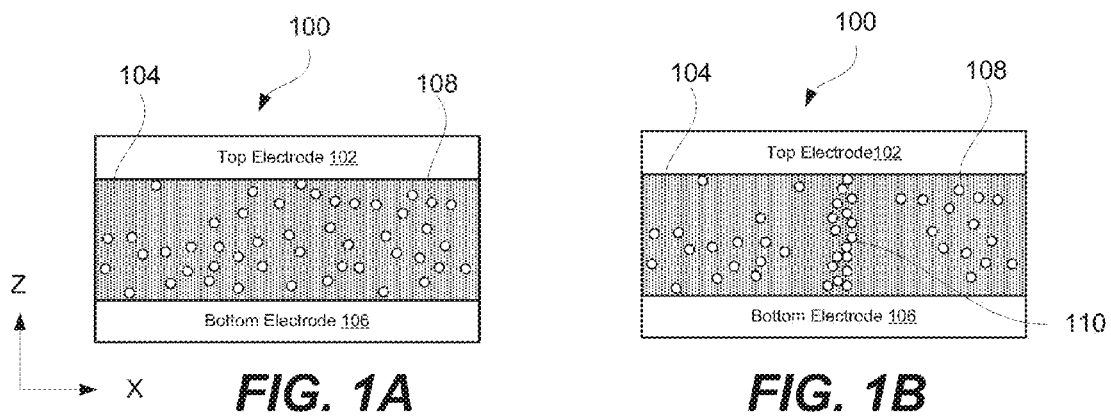
FIG. 1A  FIG. 1B
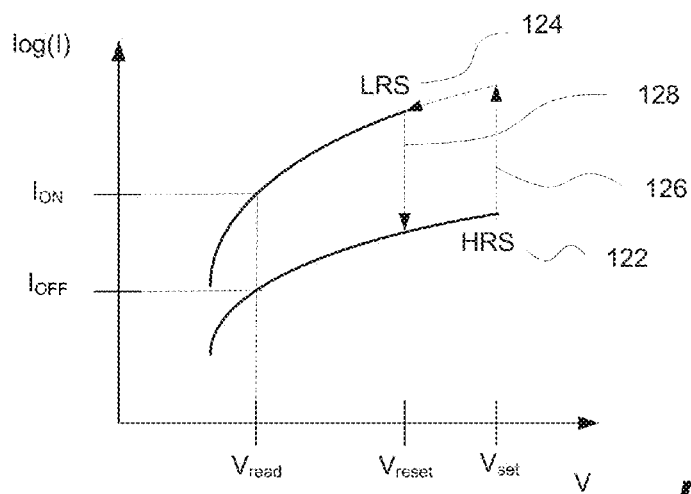
FIG. 2

RESISTIVE RANDOM ACCESS MEMORY ACCESS CELLS HAVING THERMALLY ISOLATING STRUCTURES

TECHNICAL FIELD

The present invention relates generally to semiconductor processing and more specifically to resistive random access memory access (ReRAM) cells having thermally isolating structures and methods of forming thereof.

BACKGROUND

Nonvolatile memory is computer memory capable of retaining the stored information even when unpowered. Nonvolatile memory is typically used for the task of secondary storage or long-term persistent storage and may be used in addition to volatile memory, which losses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are resistive random memory access (ReRAM) cells including resistance switching layers and thermally isolating structures for limiting heat dissipation from the switching layers during operation. Thermally isolating structures may be positioned within a stack formed by a resistive switching layer and electrodes or next to the stack. For example, a stack may include one or two thermally isolating structures. A thermally isolating structure may directly interface with a switching layer or may be separated by, for example, an electrode. Thermally isolating structures may be formed from materials having a thermal conductivity of less than 1 W/m*K, such as porous silica and mesoporous titanium oxide. A thermally isolating structure positioned in series with a switching layer generally has a resistance less than the low resistance state of the switching layer. A thermally isolating structure positioned electrically parallel to a switching layer may have a resistance greater than the high resistance state of the switching layer.

In some embodiments, a ReRAM cell includes a first layer and second layer. The first layer may be formed from a metal oxide that has at least two resistive states, such as a low resistive state and high resistive state of the metal oxide. The resistance of the first layer depends on the resistive state of the metal oxide. The metal oxide may be hafnium oxide or aluminum oxide.

The second layer of the ReRAM cell may be formed from a thermally isolating material having a thermal conductivity of less than about 1 W/m*K. In some embodiments, the thermal conductivity is less than about 0.5 W/m*K or even less than about 0.3 W/m*K. Some examples of thermally isolating materials that may be used in the second layer include porous silica, mesoporous titanium oxide, doped polysilicon, and porous crystalline silicon.

The second layer limits heat dissipation from the first layer when the metal oxide of the first layer switches between its resistive states. Specifically, when a voltage is applied to the first layer in order to change the resistive state of the metal oxide, heat is generated inside the first layer and/or at the interface of this layer and other components of the ReRAM cell. The second layer limits dissipation of this heat from the first layer, which is believed to improve switching characteristics of the ReRAM cell and, in some embodiments, to reduce power consumption of the ReRAM cell during its operation.

Resistance switching typically involves very short cycles during which a voltage is applied to the resistance switching layer, e.g., a few nanoseconds to a few microseconds. As such, very little heat is generated during this switching. A thermally isolating structure with a relatively small thickness may be sufficient to control this heat pulsing. In some embodiments, the second layer has a thickness of less than 100 Angstroms or, more specifically, less than 50 Angstroms. At the same time, the thermal resistivity of the material used to form the second layer and the proximity of the two layers should be considered. In some embodiments, the first thermally isolating material forming the second layer is porous to improve its thermally isolating characteristics. In some embodiments, a distance between the first layer and second layer is less than 100 Angstroms. Generally, a smaller distance between these two layers provides better control of heat dissipation from the first layer. Any other layer positioned in between the first layer and second layer may act as a heat sink and/or heat distribution layer and may interfere with the heat control. In some embodiments, the first layer directly interfaces the second layer.

Another consideration for thermally isolating materials is their electrical conductivity. The requirement may be driven by position and functionality of the thermally isolating structures in a ReRAM cell and in a memory array. In some embodiments, a thermally isolating material has an electrical conductivity of less If the thermal isolating structure is used as the metallic electrode (instead of an embedded resistor), the resistivity of the material used for this layer may be less than 0.1 Ohm-cm or even less than 1E-3 Ohm-cm. A thermally isolating structure made from this material may be used in series with a resistance switching layer. The ReRAM cell containing these layers may also include a separate embedded resistor. In this example, the thermally isolating structure may be operable as an electrode or a separate electrode layer may be provided. In some embodiments, the second layer may be made from a thermally isolating material having an electrical resistivity of between about 0.1 Ohm-cm to 1000 Ohm-cm. Such layers may be used as embedded electrical resistors in additional to providing thermal isolation. This second layer may act as an embedded resistor.

In some embodiments, the ReRAM cell also includes a third layer operable as an electrode. In some embodiments, the second layer operable as a thermally isolating structure may be positioned in between the first layer operable as a switching layer and third layer operable as an electrode. Note that the designation of the layers as first, second, and third are specific to each example and may change from one example to another. The second layer may prevent heat dissipation from the first layer and into the electrode. Electrodes are typically made from materials having high electrical conductivities, which tend to correspond to high thermal conductivities. As such, electrodes may not be suitable for controlling the dissipation of heat generated during resistive switching. In some embodiments, the thermally isolating structure may be used to block the heat flux from the first layer and into the third layer operable as an electrode.

Alternatively, the third layer operable as an electrode may be positioned in between the first layer and the second layer. In this example, the third layer may be sufficiently thin such that it has insignificant impact on the heat distribution within the ReRAM cell. For example, a thickness of the third layer may be less than 100 Angstroms or, more specifically, less than 50 Angstroms or even less than 20 Angstroms. In some embodiments, an electrode may be made from a thermally isolating material.

In some embodiments, another layer (e.g., the fourth) is provided on the opposite side of the first layer, the opposite side defined relative to the second layer. In other words, the first layer is positioned between the second layer and this other layer. The other (fourth) layer may include the same thermally isolating material as the second layer or some different material. Furthermore, a thickness of this other (fourth) layer and second layer may be the same or different.

In some embodiments, the first layer has a first resistance corresponding one resistive state of the metal oxide forming this layer and a second resistance corresponding to another resistive state of the metal oxide. The first resistance may be less than the second resistance. In some embodiments, the second layer may have an electrical resistance that is less than the first resistance of the first layer.

One or more thermally isolating materials may be provided within a stack containing the resistive switching layer and other layers, such as electrodes. Furthermore, thermally isolating materials may be provided such that is forms a shell around the stack. One having ordinary skills in the art would appreciate that heat dissipation occurs in every direction and not only normal to the resistance switching layer. In some embodiments, the ReRAM cell also includes a structure formed from a second thermally isolating material. For example, the structure may extend in a direction substantially normal the first and second layers. The second thermally isolating material of this structure may be different from the materials used to form a first thermally isolating structure positioned within the stack. Specifically, materials having different electrical resistivities may be used. In some embodiments, the stack includes two electrodes interfacing with the structure. The second thermally isolating material of the structure is generally more electrically resistive than the first thermally isolating material of the second layer. In some embodiments, the structure has an electrical resistance that is greater than the second resistance (corresponding to the high resistive state of the metal oxide) of the second layer.

In some embodiments, a ReRAM cell includes a first layer operable as an electrode, second layer, and third layer. The second layer may include a first thermally isolating material, such as porous silica, mesoporous titanium oxide, doped polysilicon, and porous crystalline silicon. The third layer may include a metal oxide having at least two resistive states, e.g., a first resistance corresponding to one resistive states of the metal oxide and a second resistance corresponding to another resistive states of the metal oxide such that the first resistance being less than the second resistance. The second layer may have an electrical resistance that is less than the first resistance of the third layer. Further, the second layer may limit heat dissipation from the third layer when switching between the at least two resistance states of the metal oxide.

Provided also a method of forming a ReRAM cell involving forming a first layer by depositing a thermally isolating material having a thermal conductivity of less than 1 W/m*K on a surface. The method also involves forming a second layer comprising a metal oxide having at least two resistance states onto the first layer.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIGS. 1A and 1B illustrate schematic representations of a ReRAM cell in its high resistive state (HRS) and low resistive state (LRS), in accordance with some embodiments.

FIG. 2 illustrates a plot of a current passing through a ReRAM cell as a function of a voltage applied to the ReRAM cell, in accordance with some embodiments.

DETAILED DESCRIPTION

Figure 3:
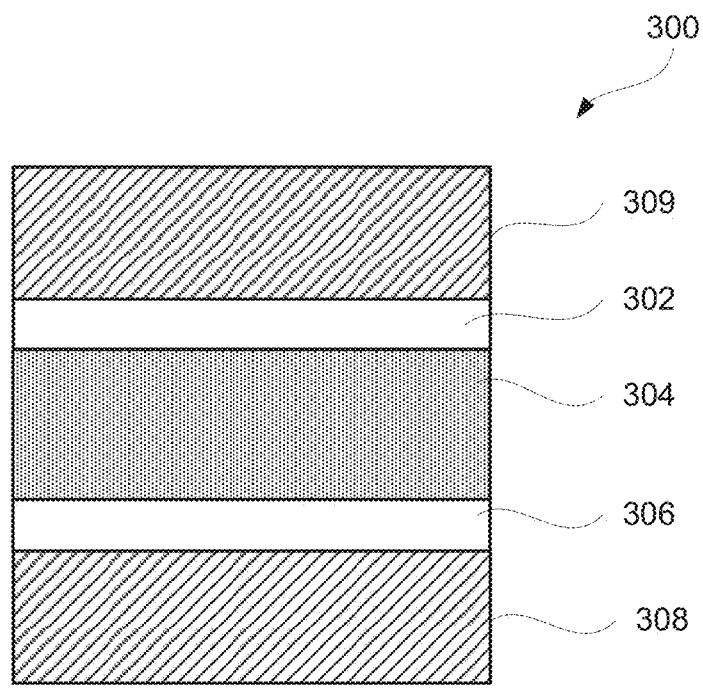
FIG. 3 illustrates a schematic representation of a stack, in which two thermally isolating structures directly interface with a resistance switching layer, in accordance with some embodiments.

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A memory cell exhibiting resistive switching characteristics generally includes multiple layers formed into a stack. This stack is sometimes referred to as a Metal-Insulator-Metal (MIM) stack. The stack includes two conductive layers operating as electrodes. These conductive layers are identified as "M" and may include metals and other conductive materials, such as doped silicon. The stack also includes an insulator layer provided in between the electrode and is indentified as "I". The insulator layer exhibits resistance changing properties characterized by different resistance states. These resistance states may be used to represent one or more bits of information. As such, the insulator layer is often referred to as a resistance switching layer and the overall cell may be referred to as ReRAM cell.

The resistance of the insulator layer is switched by applying a particular voltage (e.g., a set voltage and reset voltage) to the layer as further described below. The applied voltage causes some localized heating within the insulator layer and/or at its interfaces with other components, such as the electrodes. Without being restricted to any particular theory, it is believed that a combination of these applied voltages and localized heating causes formation and breakage of various conductive paths within the insulator layer and/or at its interfaces. Various models of conductive paths, such as filaments formed by oxygen vacancies, and resistive switching are further described below.

A control of heat dissipation within the stack may be used to reduce voltages needed to achieve resistance switching. On one hand, if heating is localized and is not allowed to rapidly dissipate, less heating may be needed to achieve the same temperature, which is believed to influence the defect mobility within the insulator layer and/or at its interfaces with other components. Furthermore, the controlled heat dissipation may help to create more localized hot spots with even greater temperatures and higher defect mobility at these spots. As a result, a lower voltage may be needed to achieve the same defect redistribution, at least within these spots, during switching operations. Overall, the resistance switching voltages needed to achieve switching are believed to depend on heat dissipation characteristics within the stacks. Thus, controlling the heat dissipation may help to significantly reduce the voltages and resulting power consumption of the memory device.

Provided are ReRAM cells including resistance switching layers and thermally isolating structures (e.g., layers) for limiting heat dissipation from the corresponding switching layers during their operation. Thermally isolating structures may be provided within a stack, adjacent to the stack, or both. For example, one or two thermally isolating structures formed into layers may be provided in a stack containing a switching layer. A thermally isolating structure may directly interface with a switching layer. In some embodiments, another layer, such as an electrode, may be provided in between the thermally isolating structure and the resistive switching layer. A thermally isolating structure may be provided adjacent to the stack containing a switching layer and may extend in a direction normal to the switching layer, for example, between a bit line and word line of the overall assembly. It should be noted that thermally isolating structures may be in the form of layers and other types of structures, e.g., shells, sleeves, fillers of the empty voids, and the like. Thermally isolating structures are often formed as layers and therefore may be referred to as thermally isolating layers. However, other types of structures may be formed from thermally isolating materials, such as shells, enclosures, conformal blanket layers, and others.

A thermally isolating structure may have thermal conductivity of less than 1 W/m*K. In general, thermally isolating materials are less thermally conductive than materials typically used for other components, such as electrodes (e.g., a thermal conductivity of platinum is 72 W/m*K). Some examples of suitable thermally isolating materials include porous silica, mesoporous titanium oxide, doped polysilicon, and porous crystalline silicon. Because of a rather short voltage pulse during the resistance switching (resulting in a short heating pulse), thermally isolating structures may be relative thin. In some embodiments, a thermally isolating structure is less than about 100 Angstroms thick. Thermally isolating structures may be porous, which increases their thermal isolating properties.

When a thermally isolating structure is used within a stack, its resistance has to be less than a resistance of the resistance switching layer in its lowest resistance state. On the other hand, when a thermally isolating structure extends along the stack and makes electrical connections with various layers in the stack, its resistance has to be higher than a resistance of the resistance switching layer in its highest resistance state to prevent short of the switching layer.

Examples of ReRAM Cells and their Switching Mechanisms

A brief description of ReRAM cells, such as ReRAM cells, and their switching mechanisms are provided for better understanding of various features and structures associated with thermally isolating structures further described below. A resistance switching non-volatile memory includes a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

A basic building unit of a memory device is a stack having a capacitor like structure. A ReRAM cell includes two electrodes and a dielectric material positioned in between these two electrodes. FIG. 1A illustrates a schematic representation of ReRAM cell 100 including top electrode 102, bottom electrode 106, and resistance switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, and other components. ReRAM cell 100 is sometimes referred to as a memory element or a memory unit.

As discussed above, resistance switching layer 104, which may be made of dielectric material, can be made to conduct through one or more filaments or conduction paths formed by applying a certain voltage. To provide this resistive switching functionality, resistance switching layer 104 includes a certain concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions).

These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sublattice and a change in the electrical conductivity. In this example, the polarity of the pulse used to perform this change determines the direction of the change, i.e., reduction or oxidation. Other resistive switching mechanisms include bipolar electrochemical metallization mechanism and thermochemical mechanism, which leads to a change of the stoichiometry due to a current-induced increase of the temperature.

Without being restricted to any particular theory, it is believed that defects 108 can be reoriented within resistance switching layer 104 to form filaments or conduction paths as, for example, schematically shown in FIG. 1B as element 110. This reorientation of defects 108 occurs when a voltage for this type of resistance switching layer 104 is applied to electrodes 102 and 106. Sometimes, reorientation of defects 108 is referred to as filling the traps by applying a set voltage (and forming one or more filaments or conduction paths) and emptying the traps by applying a reset voltage (and breaking the previously formed filaments or conduction paths).

Defects 108 can be introduced into resistance switching layer 104 during or after its fabrication. For example, a certain concentration of oxygen deficiencies can be introduced into metal oxides during their deposition or during subsequent annealing. Physical vapor deposition (PVD) and atomic layer deposition (ALD) techniques may be specifically tuned to include particular defects 108 and their distribution within resistance switching layer 104.

Operation of ReRAM cell 100 will now be briefly described with reference to FIG. 2 illustrating a logarithmic plot of a current passing through a ReRAM cell as a function of a voltage applied to the electrode of ReRAM cell, in accordance with some embodiments. ReRAM cell 100 may be either in a low resistive state (LRS) defined by line 124 or high resistive state (HRS) defined by line 122. Each of these states is used to represent a different logic state, e.g., HRS representing logic one and LRS representing logic zero or vice versa. Therefore, each ReRAM cell that has two resistance states may be used to store one bit of data. It should be noted that some ReRAM cells may have three and even more resistance states allowing multi-bit storage in the same cell.

HRS and LRS are defined by presence or absence of one or more filaments or conduction paths in resistance switching layer 104 and forming connections between these filaments or conduction paths and two electrodes 102 and 106. For example, a ReRAM cell may be initially fabricated in LRS and then switched to HRS. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). During the read operation, the state of ReRAM cell 100 or, more specifically, the resistance of resistance switching layer 104 can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistance switching layer 104 and switches ReRAM cell 100 from its HRS to LRS as indicated by dashed line 126. It should be noted that formation or breaking of filaments or conduction paths in resistance switching layer 104 may also involve forming or breaking electrical connections between these filaments and one (e.g., reactive electrode) or both electrodes. The overarching concern is passage of the current between the two electrodes.

In LRS, the resistance characteristics of ReRAM cell 100 are represented by line 124. In this LRS, when the read voltage ($V_{READ}$) is applied to electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to memory element 100 to break the previously formed filaments or conduction paths in resistance switching layer 104 and switches ReRAM cell 100 from its LRS to HRS as indicated by dashed line 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistance switching layer 104. In the bipolar switching the set voltage ($V_{SET}$) and reset voltage ($V_{RESET}$) applied to resistance switching layer 104 need to have different polarities.

In some embodiments, the write voltage ($V_{WRITE}$) is between about 100 mV and 10V or, more specifically, between about 500 mV and 5V. The length of write voltage pulses ($t_{WRITE}$) may be less than about 100 microseconds or, more specifically, less than about 5 microseconds and even less than about 100 nanoseconds. The read voltage ($V_{READ}$) may be between about 0.1 and 0.5 of the write voltage ($V_{WRITE}$). In some embodiments, the current during reading operations may be between about 0.1 micro Amps and about 100 micro Amps depending on the state of the ReRAM cell (i.e., LRS or HRS) and operating regimes. For example, a ReRAM cell may be subjected to low current operating conditions, in which LRS corresponds to currents less than about 0.2 microAmps and HRS corresponds to currents greater than about 2 micro Amps. The cell may be also subjected to high current operating conditions, in which LRS corresponds to currents less than about 0.5 micro Amps and HRS corresponds to currents greater than about 50 microAmps. The low current conditions require less power but have a smaller ratio of the two thresholds (i.e., 10× in the above examples). Furthermore, the data retention of such cells is typically substantially lower (e.g., commonly tested by subjecting cells to elevated temperature conditioning). The low current conditions may be used for NAND-replacement applications, e.g., memory arrays, while the high current conditions are typically used for embedded applications. The length of read voltage pulse ($t_{READ}$) may be comparable to the length of the corresponding write voltage pulse ($t_{WRITE}$) or may be shorter than the write voltage pulse ($t_{WRITE}$).

In some embodiments, a set voltage ($V_{SET}$) and reset voltage ($V_{RESET}$) dependent on the thickness of resistive switching layer 104. Without being restricted to any particular theory it is believed that this behavior is indicative of a bulk-mediated switching mechanism. Generally, the bulk-mediated switching mechanism forms percolation paths through the bulk of resistive switching layer 104. Materials exhibiting this behavior include higher bandgap metal oxides (i.e., oxides with a bandgap greater than 4 eV), such as hafnium oxide, aluminum oxide, tantalum oxide, zirconium oxide, and yttrium oxide. It should be noted that these oxides includes specifically formed defects and therefore are distinguishable from typical oxides of these metals, e.g., stoichiometric oxides containing no impurities. As such, it is possible to reduce required voltages by scaling down the thickness of resistive switching layer 104. Other materials, such as titanium oxide and niobium oxide, require substantially the same set and reset voltages over a wide span of their thicknesses.

ReRAM Cell Examples

Various examples of incorporating thermally isolating structures into ReRAM cells are presented below with reference to FIGS. 3-5. Specifically, FIG. 3 illustrates a schematic representation of a stack 300, in which two thermally isolating structures 302 and 306 directly interface resistance switching layer 304, in accordance with some embodiments. In this examples, thermally isolating structures 302 and 306 are formed into layers, however other types of structures may be used as well. Stack 300 may also include electrodes 308 and 309 positioned on the other sides of thermally isolating structure 302 and 306 relative to resistance switching layer 304. As such, thermally isolating structure 302 is positioned between resistance switching layer 304 and electrode 309, while thermally isolating structure 306 is positioned between resistance switching layer 304 and electrode 308. In some embodiments, an electrode still served as an interconnect of different memory cells, e.g., functions as a word line or a bit line. In other words, multiple memory cells share the same electrode, which is also connected to the control circuit. The thermally isolating structure may be provided in between the electrode and resistive switching layers to confine the local heat generation and to prevent heat dissipation. When an electrode is not used as an interconnect, the thermally isolating structure may be provided on the other wise of the electrode such that the electrode is disposed between the resistive switching layer and the thermally isolating structure.

A direct interface between a thermally isolating structure and resistance switching layer may achieve better control of thermal dissipation from the resistance switching layer than, for example, when a thermally isolating structure is spaced apart from a resistance switching layer. Heating spikes may have very short duration and tight physical coupling between the thermally isolating structure and resistance switching layer may help to achieve good response to this spike. Any additional materials provided between the thermally isolating structure and resistance switching layer may allow substantial amounts of heat to dissipate from the resistance switching layer before the thermally isolating structure is capable of blocking this heat.

However, some thermally isolating materials may not be capable to form an interface with a resistance switching layer that would ensure the resistance switching characteristics of the ReRAM cell. Specific materials may be needed at this interface to allow, for example, for oxygen to migrate in and out of the resistance switching layers. Various switching mechanisms and functions of materials provided adjacent to switching layers are described above with reference to FIGS. 1A-1B and FIG. 2. For example, at least one interface may be considered reactive, while another interface may need to be inert. For purposes of this disclosure, the reactive electrode is defined as an electrode that is involved in material transfer with the resistive switching layer during resistive switching operations, while the inert electrode is defined as an electrode that has substantially no material exchange.

Some of these interface functionalities may not be possible with thermally isolating materials used for thermally isolating structures. As such, an electrode may be provided between a thermally isolating structure and resistance switching layer as, for example, shown in FIG. 4.

Figure 4:
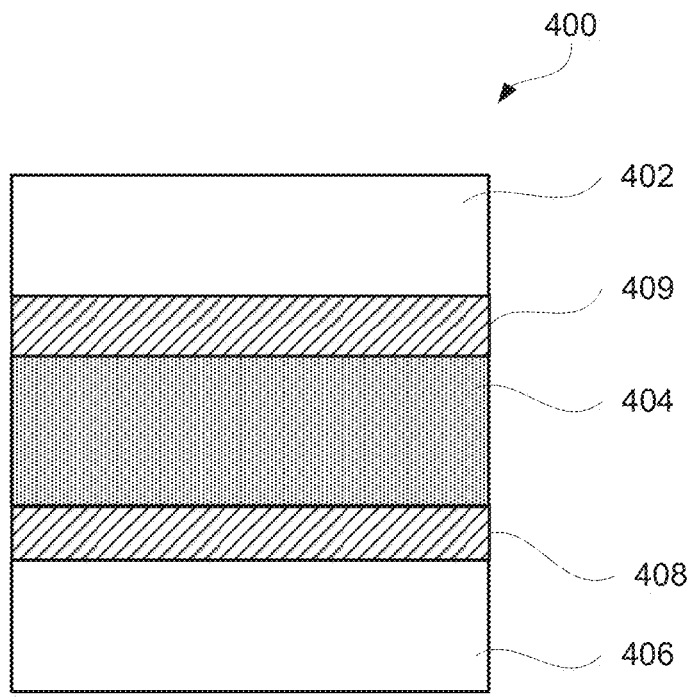
FIG. 4 illustrates a schematic representation of a stack, in which a resistance switching layer and two electrodes are positioned in between two thermally isolating structures, in accordance with some embodiments.

Specifically, FIG. 4 illustrates a schematic representation of a stack 400, in which resistance switching layer 404 and two electrodes 408 and 409 are positioned in between two thermally isolating structures 402 and 406, in accordance with some embodiments. Electrodes 408 and 409 directly interface with resistance switching layer 404 to ensure its resistance switching properties. Electrodes 408 and 409 may be particularly thin in some embodiments to ensure adequate thermal communication between resistance switching layer 404 and thermally isolating structures 402 and 406. In some embodiments, electrodes 408 and 409 may be less than about 100 Angstroms thick or, more specifically, less than about 50 Angstroms thick or even less than 20 Angstroms thick.

A resistance switching layer may be sufficiently thin to minimize heat dissipation within the layer itself. A bulky resistance switching layer may act as a heat sink thereby diminishing the function of the thermally isolating structures. In some embodiments, a resistance switching layer is less than about 100 Angstroms thick or, more specifically, less than about 50 Angstroms thick or even less than 20 Angstroms thick. Furthermore, less thermally conductive materials may be used for a resistance switching layer, such as hafnium oxide, titanium oxide, aluminum oxide, and silicon oxide.

Thermally isolating structures may be provided on both sides of a resistance switching layer or only on one side, for example, a side including a reactive electrode. The other electrode may be an inert electrode and no thermally isolating structures may be provided on that side of the resistance switching layer. Without being restricted to any particular theory, it is believed that more heat is generated at the interface with the reactive electrode than at the interface with the inert electrode due to defect migration though the interface with the reactive electrode. For example, a conductive filament may be created and broken at this interface with the reactive electrode causing more localized heating at this interface, mobility of materials, and/or other phenomena. As such, positioning a thermally isolating structure at or near this interface may be needed.

In some embodiments, electrodes may be completely replaced with thermally isolating structures. In other words, electrodes may be themselves be thermally isolating structures and made from thermally isolating materials, such as materials having a thermal conductivity of less than 1 W/m*K. In certain embodiments, one or both electrodes may be thermally isolating. For example, an reactive electrode may be thermally isolating, while the inert electrode may have a higher thermal conductivity that would qualify this electrode as a thermally isolating one.

Figure 5:
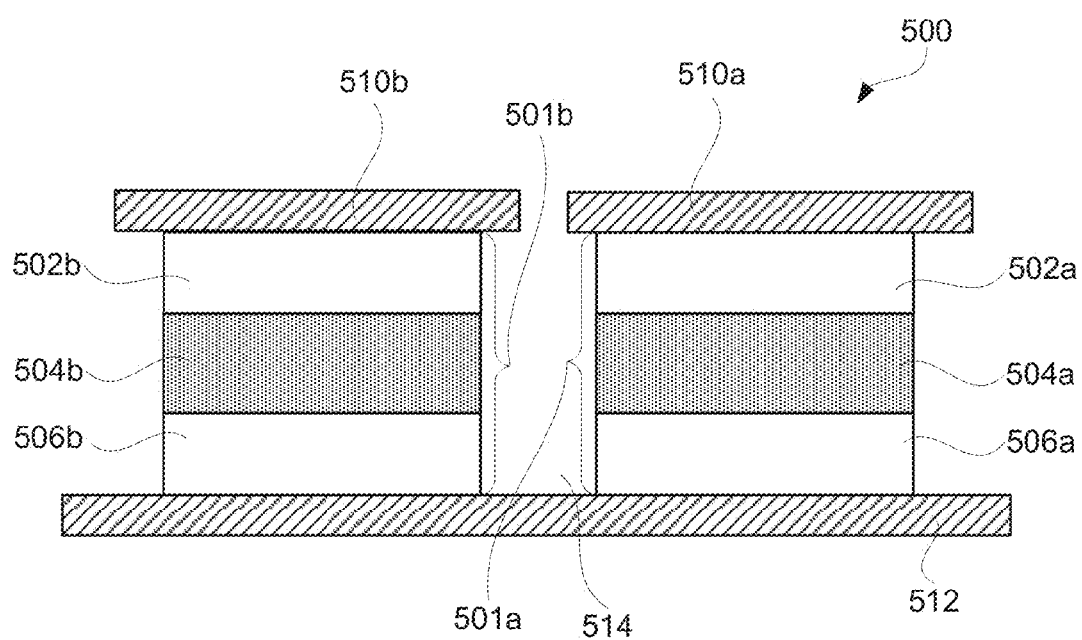
FIG. 5 illustrates a schematic representation of a memory array portion including two ReRAM cells, each having a resistance switching layer positioned between two thermally isolating electrodes, in accordance with certain embodiments

FIG. 5 illustrates a schematic representation of a memory array portion 500 including two ReRAM cells 501a and 501b, each having a resistance switching layer positioned between two thermally isolating electrodes, in accordance with some embodiments. Specifically, ReRAM cell 501a includes resistance switching layer 504a positioned between two thermally isolating electrodes 502a and 506a. ReRAM cells 501b includes resistance switching layer 504b positioned between two thermally isolating electrodes 502b and 506b. Electrodes 502a is electrically connected to a bit line 510a, while electrode 502b is electrically connected to a bit line 510b. Both electrodes 506a and 506b are shown electrically connected to word line 512.

In this example, thermally isolating electrodes 502a, 502b, 506a, and 506b serve at least two functions, i.e., an electrode function and thermally isolating function. Furthermore, one or more electrodes in one or both of ReRAM cells 501a and 501b may serve as an embedded resistor. A thermal isolation structure can also be used as an electrode. For example, a polysilicon layer formed using a low pressure CVD can be used for this application. The thermal conductivity of such material can be at least about 0.1 W/mK. The resistance can be adjusted by varying dopant concentration.

When a thermally isolating structure is made from a highly resistive material and, as a result is not suitable to function as an electrode, the structure may be positioned in between the electrode and resistive switching layer and directly interfaces the electrode. Typically, the thermally isolating structure used in such a manner is thin (e.g., less than 100 Angstroms) in order to minimize the overall resistance in the cell. For example, a mesoporous (e.g., 30-80% porosity) silicon oxide, titanium oxide, porous low-k dielectrics may be used. This thermally isolating structure may be deposited by spin-coating. Another material can be Mesoporous TiO2. The thermal conductivity can be ~0.5 W/mK and density of the film is ~2000 g/cm3.

While various thermally isolating structures described above with reference to FIGS. 3-5 generally limit heat dissipation in a direction that is substantially normal to the corresponding resistance switching layers, some heat dissipation may occur in the direction parallel to the resistance switching layers. For example, conductive filaments may be formed at peripheries of the resistance switching layers and most of the heat generation may occur at these locations. Furthermore, certain architectures of ReRAM cells may purposely reduce the interface between the resistive switching layer and electrodes (e.g., corner architectures) resulting in more heat dissipation in other surrounding materials. While some heat may dissipate into the resistive switching layers and adjacent electrodes, the remaining heat may dissipate outside of the ReRAM cell and into, for example, interlayer dielectric materials.

Returning to the example presented in FIG. 5, space 514 in between ReRAM cells 510a and 510b may be filled with one or more dielectric materials and may also have thermally isolating structure or, more generally, thermally isolating structures as further described below.

Memory Array Examples

Figure 6A:
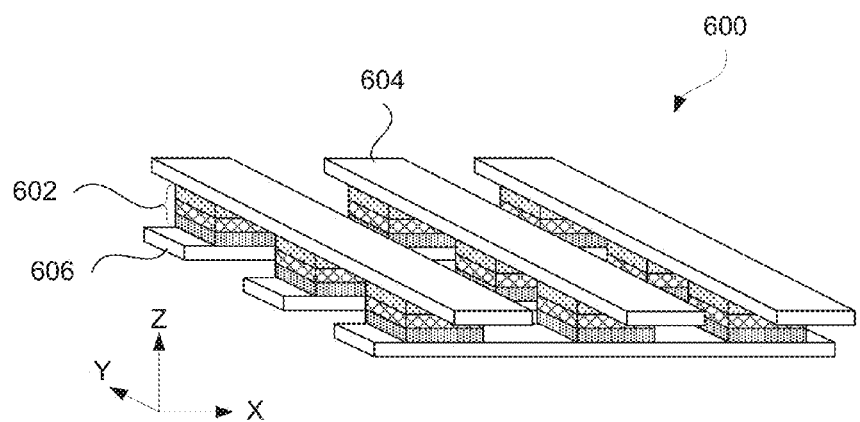
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
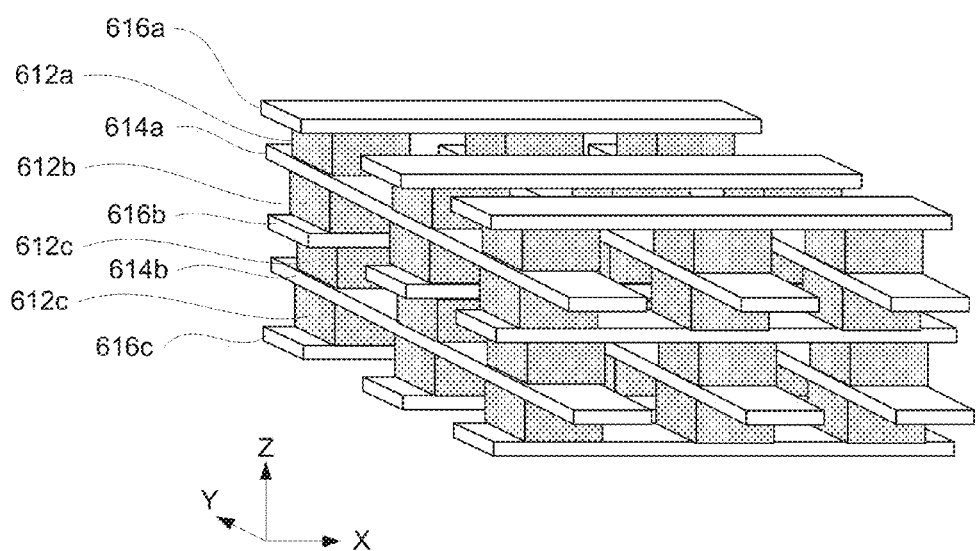

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Figure 7:
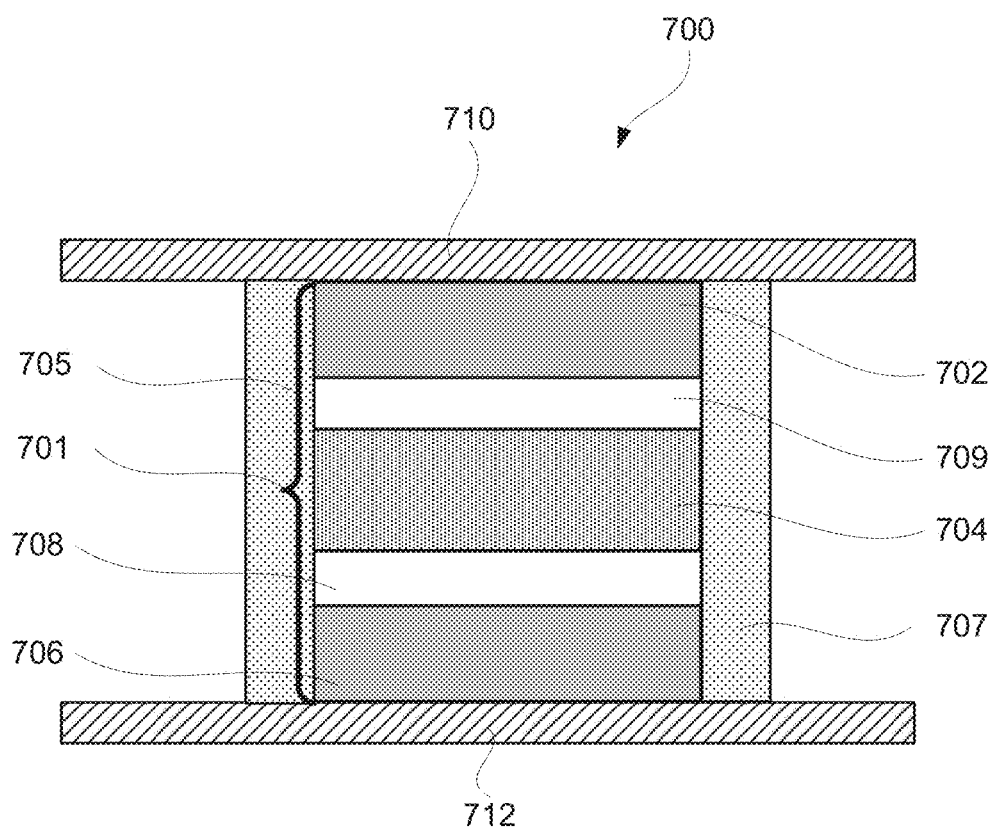
FIG. 7 illustrates a schematic representation of an array portion including a ReRAM cell provided in between two signal lines, in accordance with certain embodiments.

FIG. 7 illustrates a schematic representation of an array portion 700 including ReRAM cell 701 provided between two signal lines 710 and 712, in accordance with certain embodiments. ReRAM cell 701 includes resistance switching layer 704, two thermally isolating structures 708 and 709, and two electrodes 702 and 706. Thermally isolating structures 708 and 709 are shown to directly interface with resistance switching layer 704. All three layers are positioned in between electrodes 702 and 706. However, other embodiments described above, in which electrodes are positioned between the thermally isolating structures or in which electrodes serve as thermally isolating structures, are also within the scope.

Array portion 700 includes two thermally isolating structures 705 and 707 extending adjacent to the stack of ReRAM cell 701. As shown, thermally isolating structures 705 and 707 make direct contact with electrodes 702 and 706. To avoid an electrical short and bypassing resistance switching layer 704 through one or more of thermally isolating structures 705 and 707, these structures are formed from materials that have a sufficient electrical resistivity to prevent shortening ReRAM cell 701. In some embodiments, the electrical resistance of thermally isolating structures 705 and 707 should be generally higher than the resistance of switching layer 704 in its high resistance state.

At the same time, materials used for thermally isolating structures 708 and 709 may need to have a generally lower electrical resistance. Various electrical resistance considerations of these layers have been described above. In some embodiments, the resistance of thermally isolating structures 708 and 709 is less than the resistance of resistance switching layer 704 in its low resistance state. In some embodiments, a thermally isolating structure fully encloses a ReRAM cell with an exception of its contact with the signal lines. For example, a thermally isolating material may fill all spaces between ReRAM cells in memory arrays described above with reference to FIGS. 6A and 6B.

Processing Examples

Figure 8:
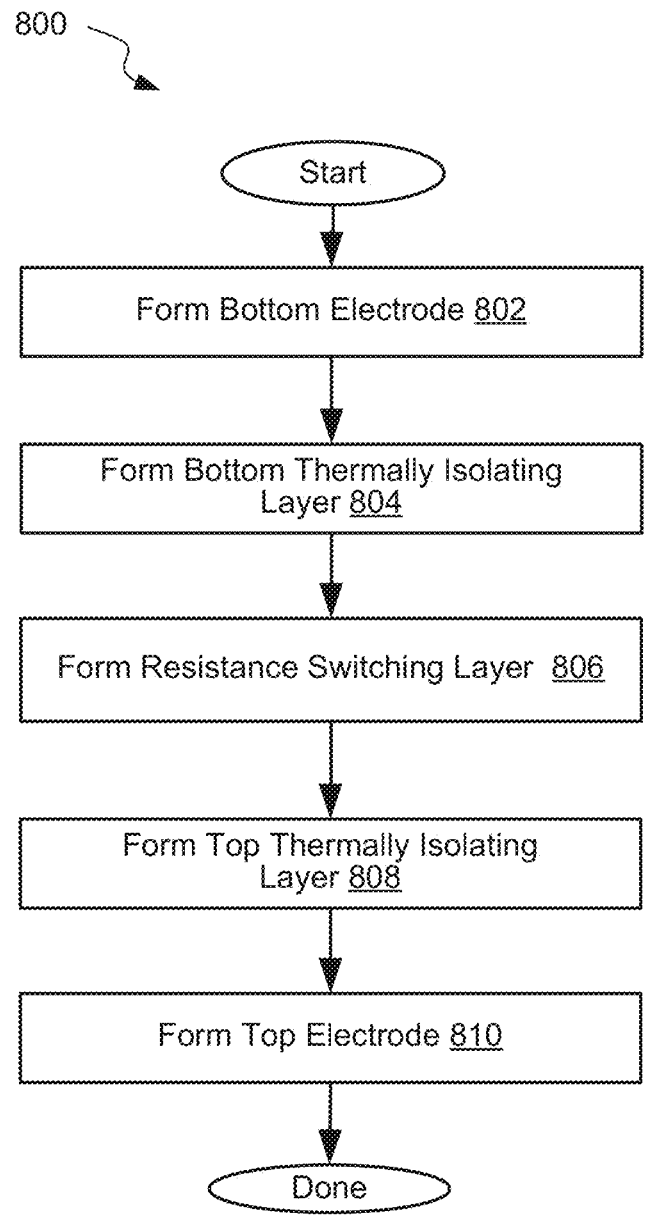
FIG. 8 illustrates a process flowchart corresponding to a method for forming a ReRAM cell, in accordance with some embodiments.

FIG. 8 illustrates a process flowchart corresponding to method 800 of forming a ReRAM cell, in accordance with some embodiments. The ReRAM cell formed in accordance with operations of method 800 may be similar to a structure described above with reference to FIG. 3. Some of the operations may be reordered to form a ReRAM cell similar to a structure described above with reference to FIG. 4. Furthermore, some operations may be eliminated or modified to form ReRAM cells similar to structures described above with reference to FIGS. 5 and 7. These variations would be understood by one having ordinary skill in the art.

Method 800 may commence with forming a first or bottom electrode during operation 802. This naming convention does not imply any particular orientation of the electrode and used merely for differentiation. The bottom electrode can be formed on a substrate, for example, a silicon substrate that may include one or more other layers already formed thereon. For example, the bottom electrode may be formed over a signal line, such as a bit line or a word line. In some embodiments, the bottom electrode is operable as a signal line. The electrode materials may include silicon (e.g., n-doped polysilicon and p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and the like may be used with the electrodes and to improve device performance and/or aid in device fabrication.

In some embodiments, one electrode may be a higher work function material, and the other electrode may be a lower work function material. For example, a noble or near noble metal may be used for one electrode. Specific examples include iridium, iridium oxide, platinum, ruthenium, and ruthenium oxide. The other electrode may be a lower work function material, such as titanium nitride.

In some embodiments, one or both electrodes of a ReRAM cell may be multi-layer electrodes formed by one or more different materials. For example, an electrode can include a base layer and capping layer. The base layer may include ruthenium, ruthenium oxide, iridium, iridium oxide, platinum, and combinations thereof. The capping layer may include tungsten, tungsten carbonitride, and/or tungsten carbon. The multi-layer electrodes can be used to improve adhesion properties and performance of memory elements in some configurations and embodiments.

As an example, a titanium nitride electrode may be formed using PVD or other suitable deposition techniques. Deposition of the titanium nitride electrode may be performed using a titanium target in a nitrogen atmosphere maintained at a pressure of between about 1-20 mTorr. The power may be maintained at 150-500 Watts with resulting in a deposition rate of about 0.5-5 Angstroms per second. These process parameters are provided as examples and generally depend on deposited materials, tools, deposition rates, and other factors. Other processing techniques, such as ALD, PLD, CVD, evaporation, and the like can also be used to deposit the first electrode.

Method 800 may proceed with forming a bottom thermally isolating structure during operation 804. Some examples of suitable thermally isolating materials include porous silica, mesoporous titanium oxide, doped polysilicon, and porous crystalline silicon.

Method 800 may proceed with forming a resistive switching layer during operation 806. The resistive switching layer may be deposited using PVD or other suitable techniques. For example, a hafnium oxide layer having a thickness of between about 5-500 Angstroms may be formed using reactive sputtering by employing a metal hafnium target in a 20-60% oxygen atmosphere. Power of 100-1000 Watts (W) may be used to achieve deposition rates of between about 0.1 and 1.0 Angstroms per second. These process parameters are provided as examples and generally depend on deposited materials, tools, deposition rates, and other factors. Other processing techniques, such as ALD, pulsed laser deposition (PLD), chemical vapor deposition (CVD), evaporation, and the like can also be used to deposit the resistive switching layer. For example, ALD can be used to form a hafnium oxide layer using hafnium precursors, such as tetrakis (diethylamido) hafnium (TDEAHf), tetrakis (dimethylamido) hafnium (TDMAHf), tetrakis (ethylmethylamido) hafnium (TEMAHf) or hafnium chloride ($HfCl_4$), and a suitable oxidant, such as water, oxygen plasma, or ozone.

A resistive switching layer may include multiple metals. For example, one metal may be used to dope an oxide of another metal. Two or more metals may be co-deposited to form one common layer or deposited in sequences to form multiple sub-layers of the resistive switching layer. For example, PVD may used to deposit a layer containing hafnium oxide and aluminum oxide. Specifically, a co-sputtering arrangement using either a hafnium target and an aluminum target in an oxygen containing atmosphere or a hafnium oxide target and an aluminum oxide target may be used. In another example, ALD may be used to co-inject hafnium and aluminum precursors at desired proportions to co-deposit a metal oxide layer or to form multiple sub-layers.

In some embodiments, method 800 may involve ion implantation, which may be implemented as a part of operation 806. The ion implantation can isovalently or aliovalently dope the resistive switching layer and can reduce forming voltages, improve set and reset voltage distributions, and increase device yield.

Method 800 may continue with forming top thermally isolating structure during operation 808 and forming top electrode during operation 810. These operations may be performed similar to operations 802 and 804 discussed above. In some embodiments, method may also involve annealing for modify various interfaces between adjacent layers and other purposes.

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive random memory access cell comprising:
   a first layer comprising a metal oxide having at least two resistive states;
   a second layer comprising a first thermally isolating material having a thermal conductivity of less than 1 W/m*K, wherein the second layer is porous; and
   a third layer operable as an electrode,
      wherein the second layer is disposed in between the first layer and the third layer,
      wherein the second layer forms an interface between the first layer and the second layer and controls heat dissipation at the interface during resistive switching of the resistive random memory access cell.

2. The resistive random memory access cell of claim 1, wherein the first thermally isolating material comprises one of porous silica, mesoporous titanium oxide, and porous crystalline silicon.

3. The resistive random memory access cell of claim 1, wherein the first thermally isolating material has an electrical resistivity of less than 0.1 Ohm-cm.

4. The resistive random memory access cell of claim 1, wherein the first thermally isolating material has an electrical resistivity of between 0.1 Ohm-cm and 1000 Ohm-cm.

5. The resistive random memory access cell of claim 1, further comprising a fourth layer provided on an opposite side of the first layer relative to the second layer such that the first layer is disposed between the second layer and the fourth layer, the fourth layer comprising the first thermally isolating material, wherein the fourth layer is porous.

6. The resistive random memory access cell of claim 1, wherein a distance between the first layer and the second layer is less than 100 Angstroms.

7. The resistive random memory access cell of claim 1, wherein the first layer directly interfaces the second layer.

8. The resistive random memory access cell of claim 1, wherein the second layer has a thickness of less than 100 Angstroms.

9. The resistive random memory access cell of claim 1, wherein the metal oxide of the first layer is one of hafnium oxide or aluminum oxide.

10. The resistive random memory access cell of claim 1, wherein the first layer has a first resistance corresponding to one of the at least two resistive states of the metal oxide and a second resistance corresponding to another one of the at least two resistive states of the metal oxide, the first resistance being less than the second resistance, and wherein the second layer has an electrical resistance less than the first resistance of the first layer.

11. The resistive random memory access cell of claim 1, further comprising a thermally isolating structure including a second thermally isolating material, the thermally isolating structure being positioned adjacent to a stack comprising the first layer, the second layer, and the third layer such that the thermally isolating structure interfaces the first layer, the second layer, and the third layer.

12. The resistive random memory access cell of claim 11, wherein the second thermally isolating material is different from the first thermally isolating material of the second layer.

13. The resistive random memory access cell of claim 11, wherein the second thermally isolating material of the structure is more electrically resistive than the second layer.

14. The resistive random memory access cell of claim 11, wherein the thermally isolating structure layer has an electrical resistance greater than an electrical resistance of the second layer.

15. A resistive random memory access cell comprising:
   a first layer operable as an electrode;
   a second layer comprising a thermally isolating material,
      wherein the thermally isolating material is one of porous silica, mesoporous titanium oxide, and porous crystalline silicon, and
      wherein the second layer has a porosity of between about 30% and 80%; and a third layer comprising a metal oxide having at least two resistive states,
      the third layer having a first resistance corresponding to one of the at least two resistive states and a second resistance corresponding to another one of the at least two resistive states,
      the first resistance being less than the second resistance,
      wherein the second layer has an electrical resistance less than the first resistance of the third layer,
      wherein the second layer is disposed between the first layer and the third layer,
      wherein the second layer forms an interface between the first layer and the second layer, and
      wherein the second layer limits heat dissipation from the third layer when the third layer switches between the at least two resistive states of the metal oxide.

16. A method of forming a resistive random memory access cell, the method comprising:
   forming a first layer operable as an electrode,
   forming a second layer over the first layer,
      wherein forming the second layer comprises depositing a thermally isolating material having a thermal conductivity of less than 1 W/m*K on a surface,
      wherein the second layer is porous; and forming a third layer over the second layer,
      wherein the third layer comprises a metal oxide having at least two resistive states,
      wherein the second layer is disposed in between the first layer and the third layer,
      wherein the second layer forms an interface between the first layer and the second layer and controls heat dissipation at the interface during resistive switching of the resistive random memory access cell.

17. The resistive random memory access cell of claim 1, wherein the first thermally isolating material comprises mesoporous titanium oxide.

18. The resistive random memory access cell of claim 1, wherein the second layer has a porosity of between about 30% and 80%.

19. The resistive random memory access cell of claim 1, wherein the first layer further comprises a dopant.

20. The resistive random memory access cell of claim 19, wherein the metal oxide of the first layer is hafnium oxide, and wherein the dopant of the first layer is aluminum oxide.

* * * * *